(12) United States Patent
Hasegawa et al.

(10) Patent No.: US 6,861,358 B2
(45) Date of Patent: Mar. 1, 2005

(54) DEPOSITION MASK AND METHOD OF PREPARING THE SAME

(75) Inventors: Isao Hasegawa, Ogaki (JP); Yoshio Miyai, Ogaki (JP); Naoya Sotani, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 627 days.

(21) Appl. No.: 09/953,926

(22) Filed: Sep. 18, 2001

(65) Prior Publication Data

US 2002/0059903 A1 May 23, 2002

(30) Foreign Application Priority Data

Nov. 22, 2000 (JP) .......................................... 2000-355680
Jul. 30, 2001 (JP) .......................................... 2001-228835

(51) Int. Cl.[7] .............................................. H01L 41/04
(52) U.S. Cl. .......................... 438/689; 438/706; 117/90
(58) Field of Search ................................. 438/706, 689; 117/90, 84

(56) References Cited

U.S. PATENT DOCUMENTS 5,814,924 A * 9/1998 Komatsu .................... 313/309

6,566,265 B2 * 5/2003 Esashi et al. ............... 438/689

FOREIGN PATENT DOCUMENTS

| JP | 10-298738 | 11/1998 |
| JP | 10-319870 | 12/1998 |

* cited by examiner

Primary Examiner—Felisa Hiteshew
(74) Attorney, Agent, or Firm—McDermott, Will & Emery

(57) ABSTRACT

A deposition mask capable of relaxing nonuniformity of the thickness of a deposit formed on a substrate and reducing the width of a non-opening part of a mask layer by reducing the thickness of the mask layer is obtained. This deposition mask comprises a mask layer formed by a single silicon thin film and a mask pattern, formed on the mask layer, including a mask opening having an opening width increased toward a deposition source. The mask layer formed by a silicon thin film can be reduced in thickness due to small deflection caused by its own weight. Thus, the width of the non-opening part of the mask layer can be reduced, whereby the width of a part formed with no deposit can be reduced. The mask opening having the opening width increased toward the deposition source reduces the probability of deposit particles, obliquely scattered from the deposition source, hitting an end of the mask opening, whereby the deposit is prevented from being reduced in thickness on an end corresponding to the end of the mask opening as well as from nonuniformity of the thickness.

15 Claims, 17 Drawing Sheets

US 6,861,358 B2

DEPOSITION MASK AND METHOD OF PREPARING THE SAME

BACKGROUND OF THE INVENTION

1. Field of the Invention

The present invention relates to a deposition mask and a method of preparing the same, and more specifically, it relates to a deposition mask employed for depositing a deposit material such as an organic EL (electroluminescence) film on a substrate and a method of preparing the same.

2. Description of the Prior Art

A deposition mask employed for depositing a deposit material on a substrate is known in general. Such a deposition mask is employed for depositing an organic EL film in the process of preparing an organic EL display for color display for forming the organic EL film serving as an emission layer, for example. FIG. 22 is a sectional view showing a conventional metal deposition mask employed for depositing an organic EL film. FIG. 23 is a model diagram showing the process of depositing the organic EL mask through the conventional metal deposition mask shown in FIG. 22.

Referring to FIG. 22, a plurality of mask openings 102 each having a vertical opening section are provided on a metal mask substrate 101 in the conventional deposition mask. The mask openings 102 are formed by etching or mechanically working the mask substrate 101.

In order to perform deposition through the metal mask substrate 101, the mask substrate 101 is first set on a position separated from a deposition side surface of a target substrate 105 at a prescribed interval, as shown in FIG. 23. Deposit particles 104 are scattered from a deposition source 103 toward the target substrate 105. Thus, the deposit particles 104 are deposited on the target substrate 105 through each mask opening 102 of the mask substrate 101, to form a deposit 108.

In general, the deposit particles 104 scattered from the deposition source 103 for deposition through the mask substrate 101 exhibit directivity as shown in FIG. 23. In this case, each mask opening 102 of the mask substrate 101 has a vertical section and hence a shadow 106 is defined on the deposit 108 formed on the target substrate 105 by an end of the mask opening 102 closer to the deposition source 103, to result in an nonuniform thickness of the deposit 108. Particularly when the mask substrate 101 has a large thickness, the length of the shadow 106 is so increased that the thickness of the deposit 108 is reduced on an end thereof. Thus, nonuniformity of the thickness of the deposit 108 is disadvantageously increased.

In order to solve the aforementioned problem, the thickness of the mask substrate 101 may be reduced. FIG. 24 is a model diagram for illustrating a problem in a conventional metal mask substrate 101 having a small thickness. Referring to FIG. 24, the metal mask substrate 101 having a small thickness is reduced in mechanical strength, to be readily deflected. In particular, the conventional metal mask substrate 101 has such large specific gravity that the same is readily deflected when reduced in thickness. When the mask substrate 101 is deflected, the distance between the mask substrate 101 and a target substrate 105 is rendered nonuniform to result in such a new problem that patterns of deposits 108 different from mask patterns 107 are formed.

As hereinabove described, the shadow 106 of the conventional metal mask substrate 101 is disadvantageously increased to result in a nonuniform thickness of each deposit 108. When the thickness of the mask substrate 101 is reduced for solving this problem, patterns of the deposits 108 different from the mask patterns 107 are disadvantageously formed. Thus, it is difficult to obtain desired patterns of the deposits 108 in general.

As shown in FIG. 25, there has been proposed a structure forming each mask opening 102a of a metal mask substrate 101 in a tapered shape having an opening width increased toward a deposition source 103. This structure is disclosed in Japanese Patent Laying-Open No. 10-298738 (1998) or 10-319870 (1998), for example. When the mask opening 102a has a tapered shape with an opening width increased toward the deposition source 103, a shadow 106 is reduced regardless of the thickness of the mask substrate 101 so that the length of a part of a deposit 108 having a small thickness on its end can be reduced. Thus, nonuniformity of the thickness of the deposit 108 can be relaxed. The aforementioned gazette discloses that the thickness of the metal mask substrate 101 having the tapered mask opening 102a is 200 $\mu$m to 500 $\mu$m.

The relation between displacement of a deposit pattern and a cone angle in the conventional deposition mask shown in FIG. 25 is now described with reference to FIGS. 26 and 27. In the following description, it is assumed that deposit particles 104 passing through each mask opening 102a straightly advance to a target substrate 105. In other words, it is assumed that the amount of inwardly deviating deposit particles 104 is extremely small and ignorable.

Referring to FIG. 26, the relation between displacement of a desired deposit pattern and the cone angle of the deposition mask is described with reference to the deposit particles 104 scattered with directivity. Symbols in FIG. 26 denote the following factors:

L: a perpendicular connecting the center of the deposition source (not shown) with the target substrate 105 r: the distance between the perpendicular L and the mask opening 102a t: the thickness of the mask substrate 101 g: the distance between the target substrate 105 and the mask substrate 101 h: the distance between the target substrate 105 and the deposition source s: the opening width of the opening 102a of the mask substrate 101

$\theta$: the angle formed by the perpendicular L and the direction of the scattered deposit particles 104

$\theta_0$: the cone angle of the mask opening 102a $a_0$: the width of pattern displacement on the inner periphery of the mask opening 102 (the distance between the position where the deposit particles 104 passing through a portion close to the inner periphery of the mask opening 102a reach the target substrate 105 and the toe of a perpendicular connecting the inner periphery of the mask opening 102a with the target substrate 105)

$b_0$: the width of pattern displacement on the outer periphery of the mask opening 102a The amount $\Delta w$ of increase/decrease of the width of the actual deposit pattern with respect to the opening width $\underline{s}$ of the mask opening 102a and the average horizontal displacement $\Delta D$ between the desired pattern (the opening of the mask opening 102a) and the actual deposit pattern are expressed as follows:

$$\Delta w = b_0 - a_0$$

$$\Delta D = (a_0 + b_0)/2$$

Referring to FIG. 26, the cone angle $\theta_0$ of the mask opening 102a is greater than or equal to the angle $\theta$ ($\theta_0 \geq \theta$) formed by the perpendicular L and the direction of the scattered deposit particles 104. In this case, influence by a shadow resulting from the thickness $\underline{t}$ of the mask substrate 101 can be ignored in the deposit pattern. Therefore, the amount $\Delta w$ of increase/decrease of the deposit pattern is expressed as follows:

$$\Delta w = 0 \qquad (1)$$

The displacement $\Delta D$ is not influenced by the thickness $\underline{t}$ of the mask substrate 101 either, but is expressed as follows:

$$\Delta D = a_0 = b_0 = g \times \tan \theta \qquad (2)$$

As clearly understood from FIG. 26, tan $\theta$ is expressed as r(h−g). In this case, the distance $\underline{g}$ is sufficiently smaller than the distance $\underline{h}$ in general, and hence tan $\theta$ is approximated as follows:

$$\tan \theta = r/h \qquad (3)$$

Hence, the above equation (2) is transformed into the following equation (4):

$$\Delta D = g \times r/h \qquad (4)$$

In this case, the displacement of the deposit pattern from the mask pattern is expressed by the above equations (1) and (4).

Referring to FIG. 27, the cone angle $\theta_0$ of the mask opening 102a is less than the angle $\theta$ ($\theta_0 < \theta$) formed by the perpendicular L and the direction of the scattered deposit particles 104. In this case, the width of pattern displacement on the inner peripheral side is decided by the surface of the mask substrate 101 closer to the deposition source. In this case ($\theta_0 < \theta$), the amount $\Delta w$ of increase/decrease of the width of the actual deposit pattern with respect to the opening width $\underline{s}$ and the average horizontal displacement $\Delta D$ between the desired pattern (the opening of the mask substrate 101) and the actual deposit pattern are increased as compared with those show in FIG. 26.

Thus, it is important that the cone angle of the mask opening 102a of the mask substrate 101 is greater than the angle of the scattered deposit particles 104.

The relation between the thickness of the mask substrate 101 and the pattern interval is now described with reference to FIGS. 28 and 29. Symbols in FIGS. 28 and 29 denote the following factors:

t: the thickness of the mask substrate 101 s: the width of the mask opening 102a d: the width of a non-opening part (the distance between the openings)

$\theta_0$: the cone angle of the mask opening 102a

While FIGS. 28 and 29 illustrate the width $\underline{s}$ as less than the width $\underline{d}$ (s<d) for the purpose of convenience, the width $\underline{s}$ is greater than the width $\underline{d}$ (s>d) in practice. In an organic EL display, a deposit is deposited on the target substrate 105 to form an emission part. In the non-opening part, no deposit is deposited on the target substrate 105 but a non-emission part is defined. In order to improve the screen of the display in brightness as well as in definition, the width $\underline{d}$ of the non-opening part defining the non-emission part is preferably minimized. The width $\underline{d}$ of the non-opening part is minimized when the non-opening part of the mask substrate 101 has an inverse-triangular section, as shown in FIG. 29.

The minimum value of the width $\underline{d}$ of the non-opening part is expressed as follows:

$$d = 2t \times \tan \theta_0 \qquad (5)$$

As clearly understood from the above equation (5), the minimum value of the width $\underline{d}$ of the non-opening part of the mask substrate 101 is decided by the thickness $\underline{t}$ of the mask substrate 101. In other words, the width $\underline{d}$ of the non-opening part of the mask substrate 101 can be reduced by reducing the thickness $\underline{t}$ of the mask substrate 101. When the width $\underline{d}$ of the non-opening part of the mask substrate 101 can be reduced, the screen of the display can be improved in brightness as well as in definition.

Japanese Patent Laying-Open No. 10-298738 disclosing the aforementioned conventional tapered mask opening 102a describes the following values as the conditions for a deposition method employing the metal mask substrate 101:

t=0.2 mm (t: the thickness of the mask substrate 101)

g=0.01 mm (g: the distance between the target substrate 105 and the mask substrate 101)

h=400 mm (h: the distance between the target substrate 105 and the deposition source)

r: 100 mm (r: the distance between the perpendicular L and the mask opening 102a)

From the above equation (3), the effective cone angle of the mask opening 102a is expressed as follows:

$$\tan \theta_0 = r/h = 0.25$$

Hence, $$\theta_0 = 14°$$

The thickness $\underline{t}$ of the mask substrate 101 is 200 $\mu$m, and hence the minimum value of the width $\underline{d}$ of the non-opening part under this condition is expressed as follows from the above equation (5):

$$d = 2t \times \tan \theta_0 = 0.1 \text{ mm} = 100 \, \mu\text{m}$$

In order to enable the organic EL display to improve the screen in brightness as well as in definition, the width $\underline{d}$ of the non-opening part must be not more than 50 $\mu$m. Assuming that the cone angle $\theta_0$ is left intact, the thickness $\underline{t}$ of the mask substrate 101 must satisfy the following equation from the above equation (5), in order to set the width $\underline{d}$ of the non-opening part to 50 $\mu$m:

$$t = d/\tan \theta_0/2 = 100 \, \mu\text{m}$$

In other words, the thickness $\underline{t}$ of the mask substrate 101 must be not more than 100 $\mu$m, in order to set the width $\underline{d}$ of the non-opening part to not more than 50 $\mu$m. However, the conventional metal mask substrate 101 is extremely deflected by its own weight if the thickness thereof is reduced due to the large specific gravity as described above, and hence no desired pattern can be obtained. The conventional metal mask substrate 101 generally has a thickness of 200 $\mu$m to 500 $\mu$m, as described in Japanese Patent Laying-Open No. 10-298738 or 10-319870. In other words, it is generally difficult to form the metal mask substrate 101 in a thickness smaller than 200 $\mu$m. Therefore, the width $\underline{d}$ of the non-opening part generally exceeds 100 $\mu$m, and it is difficult to improve the screen of the organic EL display in brightness as well as in definition.

FIG. 30 shows deformation (deflection) Z of the mask substrate 101 caused by the largest factor of gravity (own weight). Referring to FIG. 30, the deformation Z of the mask substrate 101 caused by gravity is proportional to the specific gravity ρ, inversely proportional to the Young's modulus E, and inversely proportional to the cube of the thickness t as follows:

$$Z \propto \rho E / t^3 \quad (6)$$

When the thickness t is reduced, therefore, a material having small specific gravity and a large Young's modulus is suitably employed. However, the conventional metal mask substrate 101 having large specific gravity does not satisfy these conditions. When the thickness t of the mask substrate 101 is reduced, a working technique of providing a tapered opening is required. In the conventional metal mask substrate 101, however, it is difficult to precisely work a tapered mask opening when the thickness t is reduced.

SUMMARY OF THE INVENTION

An object of the present invention is to provide a deposition mask capable of reducing the width of a part (a non-opening part of a mask layer) formed with no deposit while relaxing nonuniformity of the thickness of a deposit formed on a target substrate.

Another object of the present invention is to provide a deposition mask readily allowing working of a tapered mask opening also when reduced in thickness and a method of preparing the same.

A deposition mask according to a first aspect of the present invention, employed for depositing a deposit material on a target substrate, comprises a mask layer formed by a single silicon thin film and a mask pattern, formed on the mask layer formed by a single silicon thin film, including a mask opening having an opening width increased toward a deposition source.

In the deposition mask according to the first aspect having the aforementioned structure, the mask layer formed by a silicon thin film has smaller specific gravity (smaller weight) and a larger Young's modulus (smaller strain) than a conventional metal mask layer, and hence deflection of the mask layer caused by its own weight can be more reduced as compared with the conventional metal mask layer. Therefore, the mask layer can be more reduced in thickness than the prior art. Thus, the width of a non-opening part of the mask layer can be reduced due to the small thickness of the mask layer, thereby reducing the width of a part formed with no deposit. Consequently, the width of a non-emission part can be reduced when the deposit is an organic EL film, for example, whereby the screen of a display formed by the organic EL film can be improved in brightness as well as in definition.

In the deposition mask according to the first aspect, the mask layer is formed by the silicon thin film suitable for fine working, whereby a tapered mask opening can be precisely worked also when the thickness of the mask layer is reduced, dissimilarly to the conventional metal mask layer. Thus, a deposit pattern can be formed in high precision. Further, the mask layer is made of silicon having a small thermal expansion coefficient, whereby strain of the mask layer caused by temperature change in deposition can be reduced.

The deposition mask according to the first aspect is provided with the mask pattern including the mask opening having an opening width increased toward the deposition source, whereby the probability of deposit particles, obliquely scattered from the deposition source, hitting an end of the mask opening can be reduced when the deposit is deposit on the target substrate through the deposition mask.

Thus, the deposit can be prevented from being reduced in thickness on an end corresponding to the end of the mask opening. Therefore, nonuniformity of the thickness of the deposit can be reduced. According to the first aspect, as hereinabove described, the width of the part (the non-opening part of the mask layer) formed with no deposit can be reduced by reducing the thickness of the mask layer while reducing nonuniformity of the thickness of the deposit.

In the deposition mask according to the first aspect, the mask layer formed by a single silicon thin film preferably has a thickness of at least 10 μm and not more than 100 μm. When the thickness of the mask layer formed by a silicon thin film is set to such a range, the screen of an organic EL display can be improved in brightness as well as in definition while preventing reduction of the mechanical strength of the mask layer. In order to enable the organic EL display to improve the brightness as well as definition of the screen, the minimum value of the width d of the non-opening part (see FIG. 29) must be not more than 50 μm. In order to set the width d of the non-opening part to not more than 50 μm, the thickness of the mask layer formed by a silicon thin film must be set to not more than 100 μm from the above equation (5). If the thickness of the mask layer formed by a silicon thin film is smaller than 10 μm, the mechanical strength thereof is reduced and the mask layer is too thin to handle. Therefore, the thickness of the mask layer formed by a single silicon thin film is set in the range of at least about 10 μm and not more than about 100 μm.

In the deposition mask according to the first aspect, a non-opening part of the mask layer formed by a single silicon thin film preferably has a width of not more than 50 μm. Thus, the screen of an organic EL display can be improved in brightness as well as in definition.

In the deposition mask according to the first aspect, the mask opening of the mask layer formed by a single silicon thin film preferably has a cone angle of at least 5° and not more than 70°. Thus, the probability of deposit particles, obliquely scattered from the deposition source, hitting an end of the mask opening can be reduced when the deposit is deposited on the target substrate through the deposition mask. Therefore, the deposit can be prevented from being reduced in thickness on an end corresponding to that of the mask opening. Consequently, nonuniformity of the thickness of the deposit can be reduced.

In the deposition mask according to the first aspect, the mask opening preferably includes a tapered through hole formed by performing dry etching on the mask layer. The tapered through hole can be readily formed by adjusting dry etching conditions. Further, the mask pattern can be precisely formed by employing dry etching.

In the deposition mask according to the first aspect, the mask opening preferably includes a tapered through hole formed by performing anisotropic wet etching on the mask layer. A through hole having a large cone angle can be readily formed by anisotropic etching. Consequently, nonuniformity of the thickness of the deposit can be more reduced on an end of the mask opening. In this case, the mask layer is preferably formed by a single-crystalline silicon thin film having a (100) plane. Thus, an etching surface of a (111) plane can be formed when employing an alkaline etching solution having crystal orientation dependency on the (100) plane of silicon as a wet etching solution, for example, whereby the mask layer can be readily subjected to anisotropic wet etching.

The deposition mask according to the first aspect preferably further comprises a support bonded to the mask layer for supporting the mask layer. When the support supporting the mask layer is provided in the aforementioned manner, the mechanical strength of the deposition mask including the mask layer can be improved, whereby the deposition mask can be readily handled. Further, the mechanical strength of the deposition mask including the mask layer can be so improved that the thickness of the mask layer formed by a silicon thin film can be reduced as compared with the case of employing the single mask layer as the deposition mask. Thus, the width of the non-opening part of the mask layer can be further reduced. In this case, the support preferably contains silicon. When the support is made of silicon identically to the mask layer, deflection caused by temperature change can be effectively prevented. In this case, the mask layer and the support are preferably bonded to each other by a eutectic layer of silicon and gold. When such a bonding structure formed by a eutectic layer of silicon and gold is employed, no gas is generated in a deposition apparatus and chemical resistance can be improved.

In the aforementioned structure provided with the support supporting the mask layer, the support may contain a metal material having a thermal expansion coefficient close to that of silicon. When the support is made of a metal material having a thermal expansion coefficient close to that of silicon, deflection caused by temperature change can be reduced. In this case, the support preferably contains covar (29Ni-18Co—Fe).

In the aforementioned structure provided with the support supporting the mask layer, the support and the mask may be bonded to each other through an adhesive layer. When such an adhesive layer is employed, the support and the mask layer can be bonded to each other through a simple process.

In the deposition mask according to the first aspect, the target substrate preferably includes a plurality of first deposition regions subjected to deposition of a first material and a plurality of second deposition regions subjected to deposition of a second material different from the first material, a plurality of mask openings of the mask pattern are preferably provided on positions corresponding to either the first deposition regions or the second deposition regions, and the plurality of mask openings are preferably at least partially provided at different intervals. Also when a plurality of different types of deposition materials are deposited on the target substrate, deposition masks corresponding to the respective deposition materials can be readily formed according to this structure. In this case, the minimum width of a non-opening part between the plurality of mask openings is preferably not more than 50 μm. According to this structure, the minimum width of a part formed with no deposit can be reduced. Thus, the width of a non-emission part can be reduced when the deposit is an organic EL film, for example, whereby the screen can be improved brightness as well as definition in a display formed by the organic EL film.

A method of preparing a deposition mask according to a second aspect of the present invention comprises steps of forming a mask layer formed by a single silicon thin film on a support layer through an intermediate layer, etching the mask layer thereby forming a mask pattern including a tapered mask opening having an opening width increased toward a deposition source and removing the intermediate layer thereby separating the mask layer formed with the mask pattern from the support layer.

In the method of preparing a deposition mask according to the second aspect, the thin mask layer formed by a single silicon thin film including the mask pattern including the tapered mask opening having an opening width increased toward the deposition source can be readily separated due to the aforementioned structure. Consequently, it is possible to readily prepare a deposition mask capable of relaxing nonuniformity of the thickness of a deposit formed on a target substrate and reducing the width of a part (a non-opening part of the mask layer) formed with no deposit by reducing the thickness of the mask layer.

In the method of preparing a deposition mask according to the second aspect, the intermediate layer preferably includes an etching stopper layer serving as a stopper when etching the mask layer. Thus, the mask layer can be readily etched. In this case, the etching stopper layer may include a silicon oxide film.

In the method of preparing a deposition mask according to the second aspect, the mask layer formed by a single silicon thin film preferably has a thickness of at least 10 μm and not more than 100 μm. When the thickness of the mask layer formed by a silicon thin film is set to such a range, the screen of an organic EL display can be improved in brightness as well as in definition while preventing reduction of the mechanical strength of the mask layer.

In the method of preparing a deposition mask according to the second aspect, a non-opening part of the mask layer formed by a single silicon thin film preferably has a thickness of not more than 50 μm. Thus, the screen of an organic EL display can be improved in brightness as well as in definition.

In the method of preparing a deposition mask according to the second aspect, the mask opening of the mask layer formed by a single silicon thin film preferably has a cone angle of at least 5° and not more than 70°. Thus, the probability of deposit particles, obliquely scattered from the deposition source, hitting an end of the mask opening can be reduced when the deposit is deposit on the target substrate through the deposition mask. Therefore, the deposit can be prevented from being reduced in thickness on an end corresponding to that of the mask opening. Consequently, nonuniformity of the thickness of the deposit can be reduced.

In the method of preparing a deposition mask according to the second aspect, the mask opening preferably includes a tapered through hole formed by performing dry etching on the mask layer. The tapered through hole can be readily formed by adjusting dry etching conditions. Further, the mask pattern can be precisely formed by employing dry etching.

In the method of preparing a deposition mask according to the second aspect, the mask opening preferably includes a tapered through hole formed by performing anisotropic etching on the mask layer. A through hole having a large cone angle can be readily formed by anisotropic etching. Consequently, nonuniformity of the thickness of the deposit can be more reduced on an end of the mask opening. In this case, the mask layer is preferably formed by a single-crystalline silicon thin film having a (100) plane. Thus, an etching surface of a (111) plane can be formed when employing an alkaline etching solution having crystal orientation dependency on the (100) plane of silicon as a wet etching solution, for example, whereby the mask layer can be readily subjected to anisotropic wet etching.

A method of preparing a deposition mask according to a third aspect of the present invention comprises steps of forming a support having an opening on a region corresponding to a mask opening, forming a mask layer formed by a single silicon thin film including a mask pattern having a tapered mask opening having an opening width increased toward a deposition source and bonding the mask layer and the support to each other.

In the method of preparing a deposition mask according to the third aspect, the mechanical strength of the deposition mask including the mask layer can be improved by bonding the support supporting the mask layer to the mask layer, whereby the deposition mask can be readily handled. Further, the mechanical strength of the deposition mask including the mask layer can be so improved that the thickness of the mask layer formed by a silicon thin film can be more reduced as compared with the case of employing the single mask layer as the deposition mask. Thus, the width of a non-opening part of the mask layer can be further reduced.

In the method of preparing a deposition mask according to the third aspect, the support preferably contains silicon. When the support is made of silicon identically to the mask layer, deflection caused by temperature change can be effectively prevented. In this case, the mask layer and the support are preferably bonded to each other by a eutectic layer of silicon and gold. When such a bonding structure formed by a eutectic layer of silicon and gold is employed, no gas is generated in a deposition apparatus and chemical resistance can be improved.

In the method of preparing a deposition mask according to the third aspect, the support may contain a metal material having a thermal expansion coefficient close to that of silicon. When the support is made of a metal material having a thermal expansion coefficient close to that of silicon, deflection caused by temperature change can be reduced. In this case, the support preferably contains covar (29Ni-18Co—Fe).

In the method of preparing a deposition mask according to the third aspect, the support and the mask may be bonded to each other through an adhesive layer. When such an adhesive layer is employed, the support and the mask layer can be bonded to each other through a simple process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
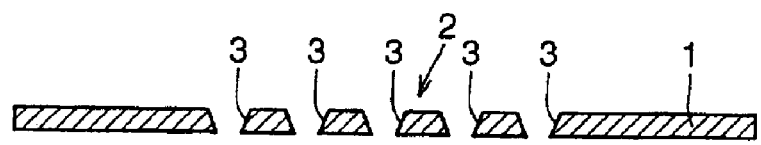
FIG. 1 is a sectional view showing a deposition mask according to a first embodiment of the present invention.
Figure 2:
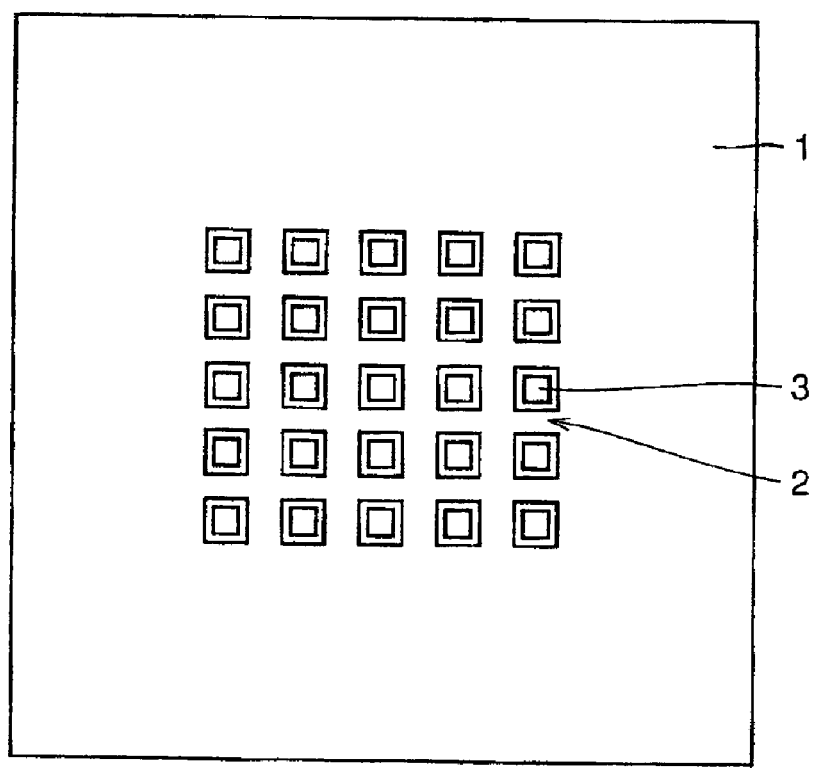
FIG. 2 is a top plan view of the deposition mask according to the first embodiment shown in FIG. 1.

Referring to FIGS. 1 and 2, a deposition mask according to a first embodiment of the present invention employs a mask layer 1 formed by a single silicon thin film, dissimilarly to the conventional mask layer formed by the metal mask substrate. The silicon thin film forming the mask layer 1 consists of N-type single-crystalline silicon having a (100) plane. The mask layer 1 formed by a single silicon thin film has a thickness of at least about 10 $\mu$m and not more than about 100 $\mu$m.

Figure 23:
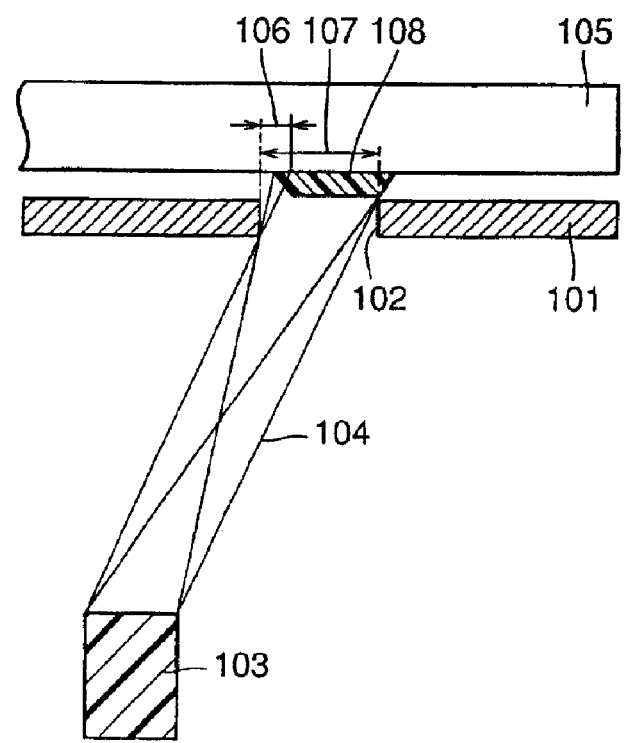
FIG. 23 is a model diagram for illustrating a process of deposition with the conventional metal deposition mask shown in FIG. 22.
Figure 24:
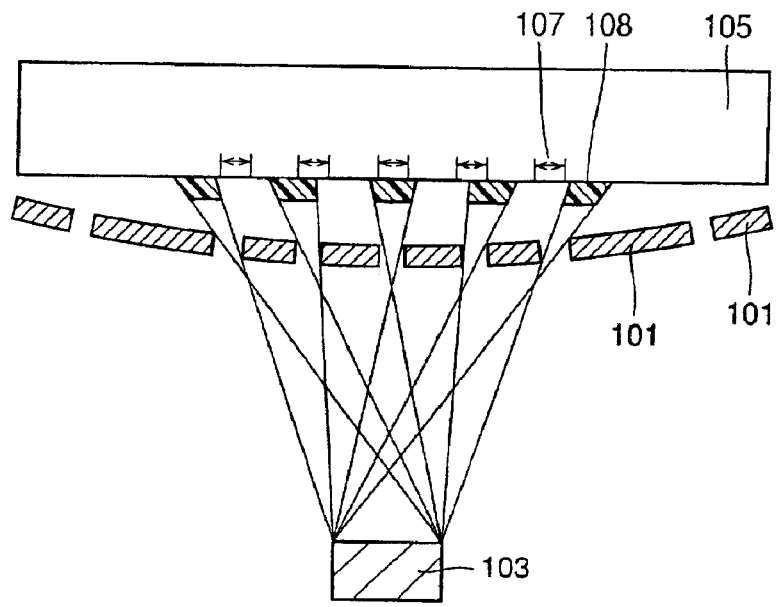
FIG. 24 is a model diagram for illustrating a problem in the case of reducing the thickness of the conventional metal deposition mask.
Figure 25:
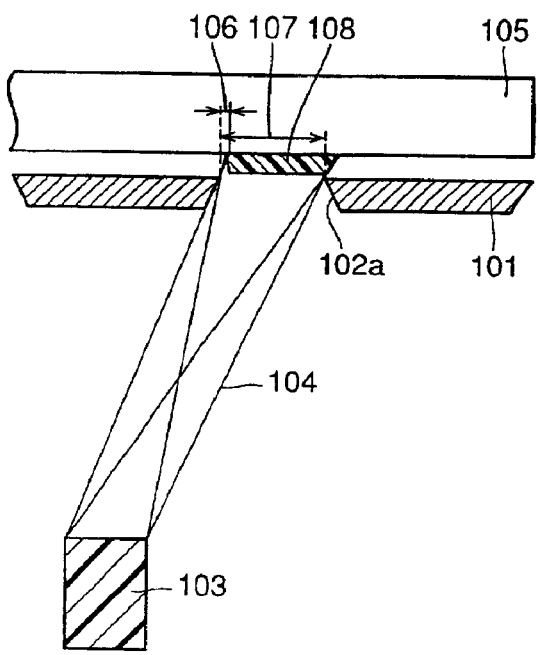
FIG. 25 is a model diagram for illustrating a process of deposition with a conventionally proposed metal deposition mask.
Figure 26:
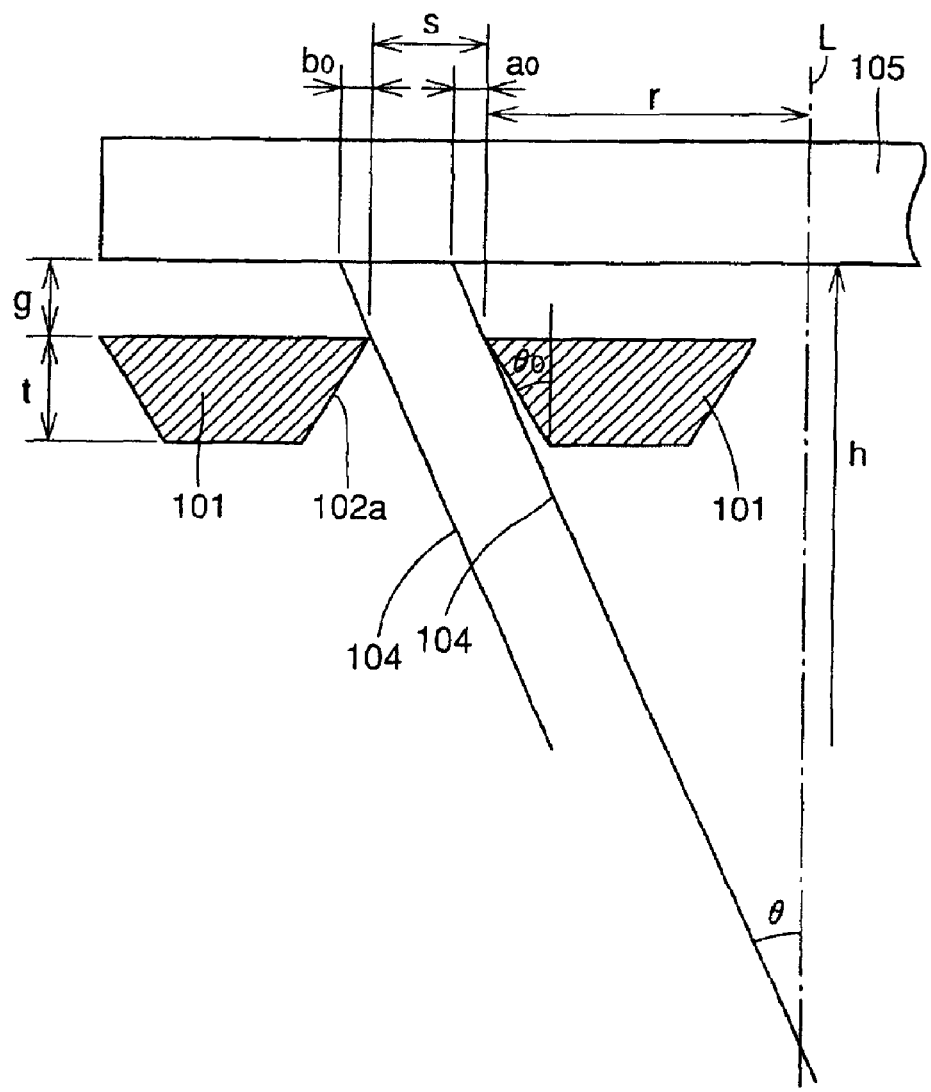
FIGS. 26 and 27 are model diagrams for illustrating the relation between displacement of a deposit pattern and a cone angle in the conventionally proposed deposition mask shown in FIG. 25.
Figure 27:
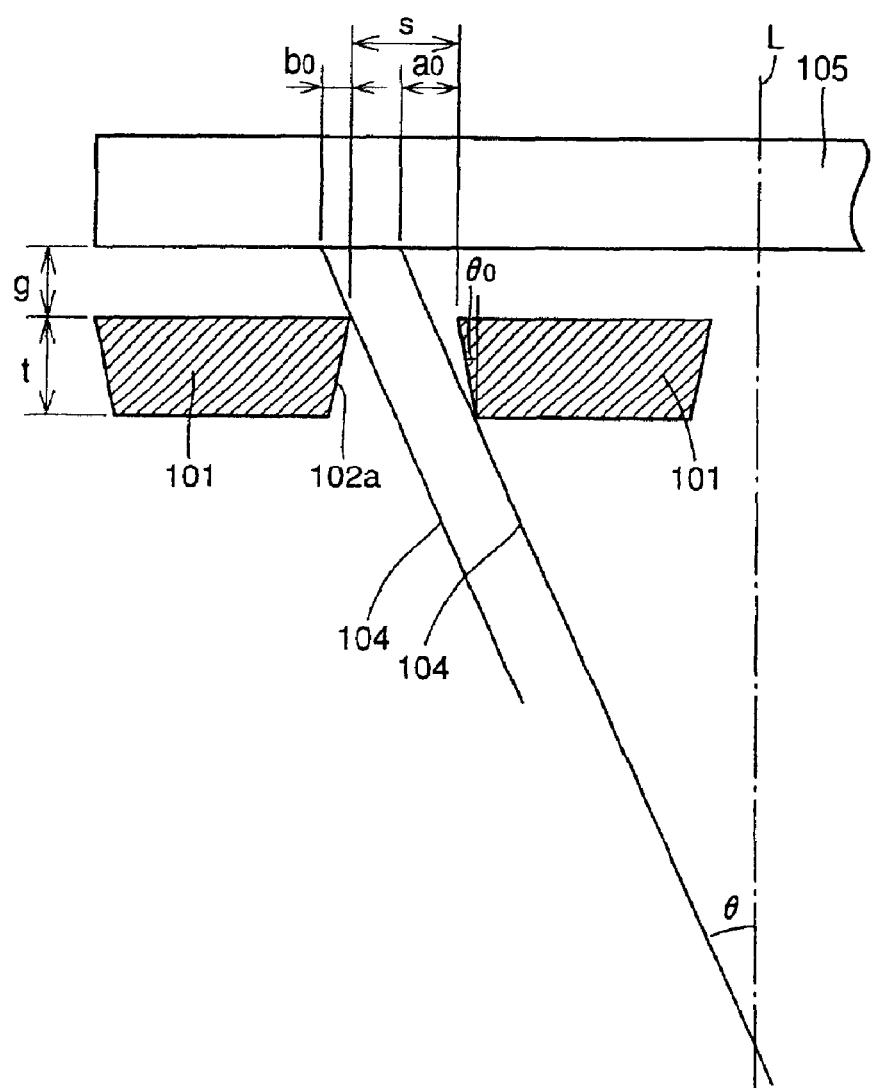
Figure 28:
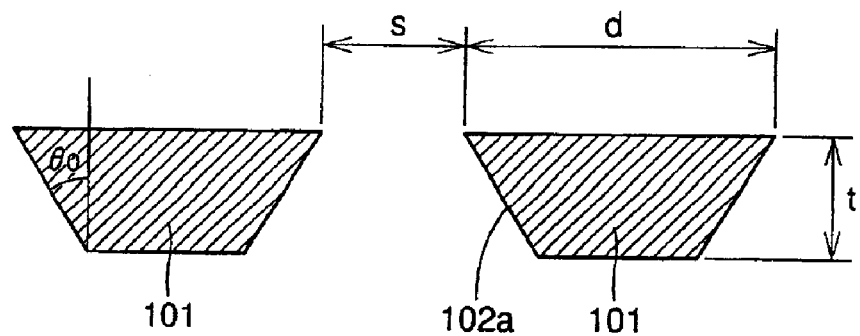
FIGS. 28 and 29 are model diagrams for illustrating the relation between a tapered opening and the thickness of a mask substrate (mask layer)
Figure 29:
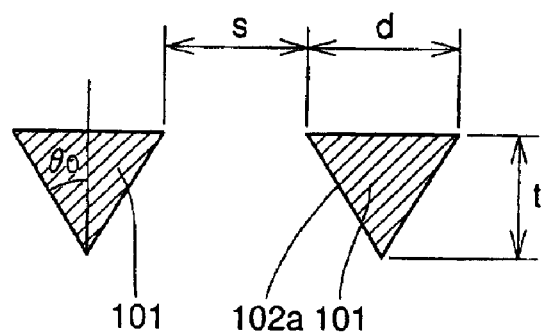
Figure 30:
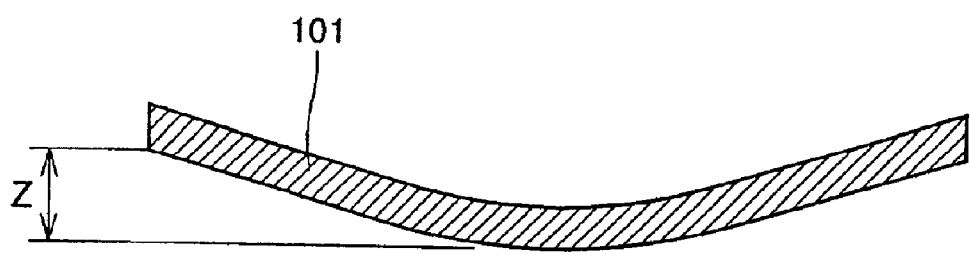
FIG. 30 is a model diagram for illustrating deflection of the conventional metal deposition mask caused by its own weight.

The thickness of the mask layer 1 formed by a silicon thin film is set in the aforementioned range for the following reason: In order to enable an organic EL display to improve the screen in brightness as well as in definition, the minimum value (see FIG. 23) of the width $\underline{d}$ of a non-opening part must be not more than 50 $\mu$m, as described above. In order to set the width $\underline{d}$ of the non-opening part to not more than 50 $\mu$m, the thickness of the mask layer 1 must be set to not more than 100 $\mu$m from the above equation (5). If the thickness of the mask layer 1 is smaller than 10 $\mu$m, however, the mechanical strength is reduced and the mask layer 1 is too thin to handle. According to the first embodiment, therefore, the thickness of the mask layer 1 formed by a single silicon thin film is set to at least about 10 µm and not more than about 100 µm.

The mask layer 1 formed by a silicon thin film is provided with a mask pattern 2 including tapered mask openings 3 having opening widths increased toward a deposition source.

Figure 22:
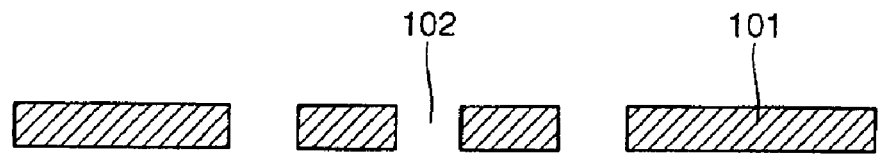
FIG. 22 is a sectional view showing a conventional metal deposition mask.

According to the first embodiment, the mask layer 1 formed by a silicon thin film as described above is reduced in specific gravity and increased in Young's modulus as compared with the conventional metal mask substrate (mask layer) 101 (see FIG. 22), to be lightweight and reduced in strain. Thus, deflection of the mask layer 1 caused by its own weight can be reduced as compared with the conventional metal mask substrate 101. Consequently, the thickness of the mask layer 1 can be more reduced as compared with the prior art. While it is difficult to reduce the thickness of the conventional metal mask substrate 101 to not more than about 200 µm, the mask layer 1 can be readily formed to have a thickness of not more than 100 µm according to this embodiment.

According to the first embodiment, the thickness of the mask layer 1 can be reduced as described above, whereby the width of the non-opening part of the mask layer 1 can also be reduced. Thus, the width of a non-emission part can be reduced when a deposit is an organic EL film, whereby the screen of a display formed by the organic EL film can be improved in brightness as well as in definition.

According to the first embodiment, further, the mask layer 1 is formed by a silicon thin film suitable for fine working, whereby the tapered mask openings 3 can be precisely worked also when the thickness of the mask layer 1 is reduced, dissimilarly to the conventional metal mask substrate 101. Thus, a deposit pattern can be precisely formed.

According to the first embodiment, the mask layer 1 is formed by a silicon thin film having a small thermal expansion coefficient, whereby strain of the mask layer 1 caused by temperature change in deposition can be reduced. Silicon has a small thermal expansion coefficient of about $2.3 \times 10^{-6}$/K.

Figure 3:
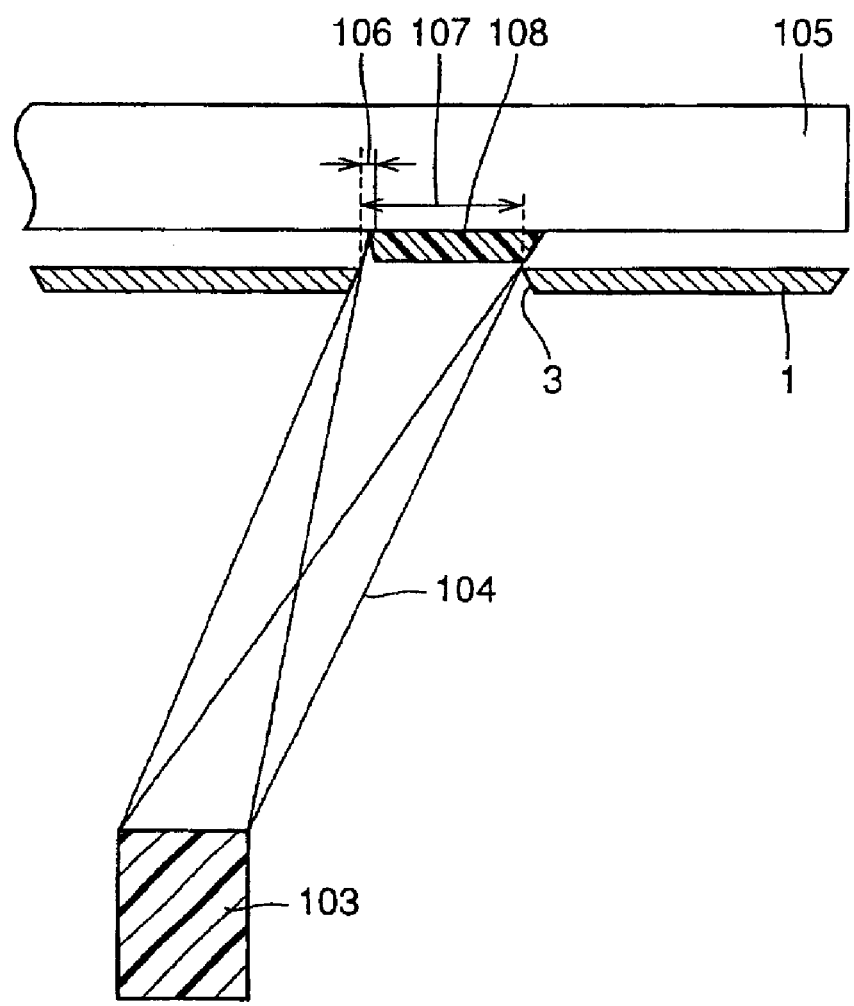
FIG. 3 is a model diagram for illustrating a process of deposition with the deposition mask according to the first embodiment.

A process of performing deposition with the mask layer 1 according to the first embodiment is now described with reference to FIG. 3. First, the mask layer 1 is set on a position separated from the surface of a target substrate 105 at a prescribed space. In this case, each mask opening 3 of the mask layer 1 is so arranged that the cone angle thereof is increased toward a deposition source 103. In this state, deposit particles 104 are scattered from the deposition source 103 toward the target substrate 105. Thus, the deposit particles 104 are deposited on the surface of the target substrate 105 through the mask opening 3 of the mask layer 1. Consequently, a deposit 108 is formed on the surface of the target substrate 105.

According to the first embodiment, the tapered mask openings 3 increased toward the deposition source 103 are so provided that the probability of the deposit particles 104, obliquely scattered from the deposition source 103, hitting an end of each mask opening 3 can be reduced. Thus, the length of a shadow 106 is reduced, and the deposit 108 can be prevented from being reduced in thickness on an end corresponding to the end of the mask opening 3. Thus, nonuniformity of the thickness of the deposit 108 can be reduced, so that a uniform and precise deposit pattern can be obtained.

According to the first embodiment, as hereinabove described, nonuniformity of the thickness of the deposit 108 can be reduced, while the width of the non-opening part can also be reduced by reducing the thickness of the mask layer 1.

FIGS. 4 to 8 are sectional views for illustrating a process of preparing a deposition mask formed by the mask layer 1 according to the first embodiment shown in FIGS. 1 and 2. The process of preparing the mask layer 1 forming the deposition mask according to the first embodiment is now described with reference to FIGS. 4 to 8.

First, the mask layer 1 formed by a silicon oxide film is formed on a support layer 4 consisting of silicon through an etching stopper layer (intermediate layer) 5 formed by a silicon oxide film. Thus, a mask substrate of a three-layer structure is obtained. A method of forming the mask substrate of a three-layer structure shown in FIG. 4, generally referred to as an SOI (silicon on insulator) substrate, is well known in the art and hence redundant description is omitted. The support layer 4 of silicon, provided for maintaining mechanical strength in working, has a thickness of about 100 µm to about 800 µm. The etching stopper layer 5 formed by a silicon oxide film has a thickness of about 0.5 µm to about 5 µm. The mask layer 1 formed by a silicon thin film has a thickness of at least about 10 µm and not more than about 100 µm.

Figure 5:
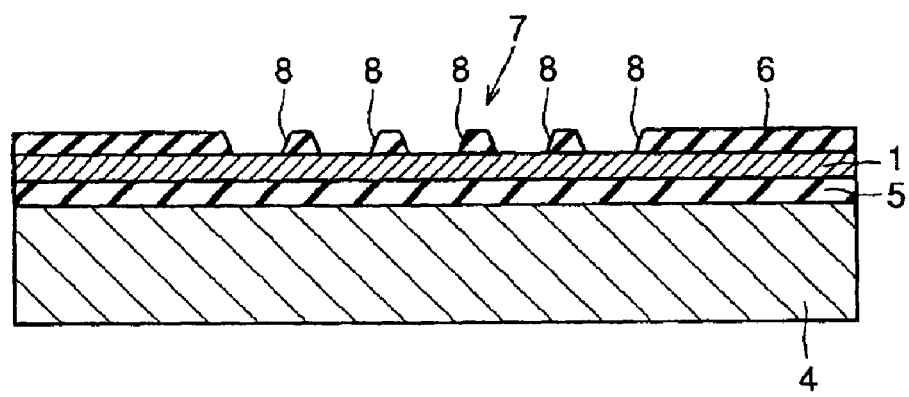

As shown in FIG. 5, a silicon oxide film 6 is formed on the mask layer 1 by plasma CVD. A pattern 7 having tapered openings 8 is formed on the silicon oxide film 6 by photolithography and dry etching. When the silicon oxide film 6 is etched under conditions of a plasma output of 500 W, a pressure of 9 Pa, a substrate temperature of 20° C. and $CF_4$, Ar and $O_2$ gas ratios of 3:6:1, for example, the openings 8 are formed with a cone angle of about 40°.

This cone angle can be readily varied with the gas ratios. More specifically, the cone angle can be increased by increasing the content of $O_2$ and reducing the content of Ar. The cone angle of the openings 8 is adjusted within the range of 5° to 70°.

Figure 6:
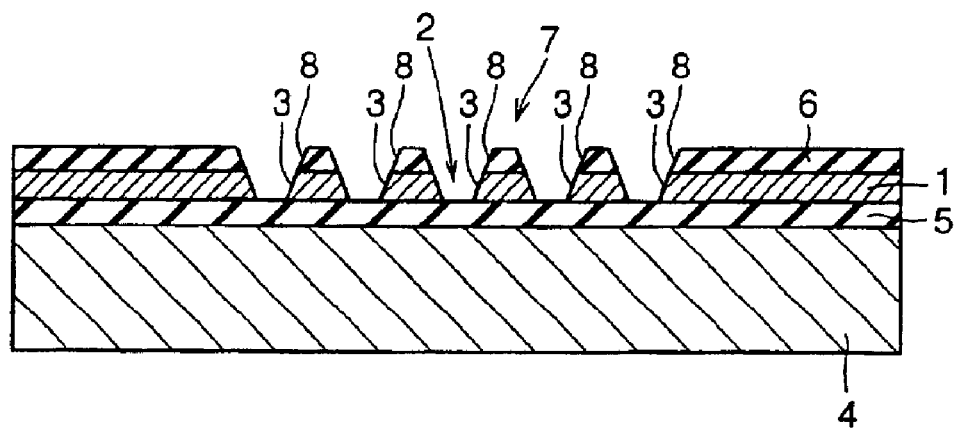

As shown in FIG. 6, dry etching (anisotropic etching) is performed on the mask layer 1 formed by a silicon thin film through the pattern 7 of the silicon oxide film 6 serving as an etching mask, thereby forming a mask pattern 2 including the mask openings 3 having a tapered shape (cone angle: 5° to 70°, about 40° in this embodiment) reflecting that of the openings 8 of the silicon oxide film 6. Conditions for this etching are a plasma output of 200 W, a pressure of 13 Pa, a substrate temperature of 20° C. and an HBr and $Cl_2$ gas ratio of 1:3. In this dry etching for forming the mask openings 3, the etching stopper layer 5 formed by a silicon oxide film serves as an etching stopper. Thus, the mask pattern 2 having the tapered mask openings 2 can be formed.

Figure 7:
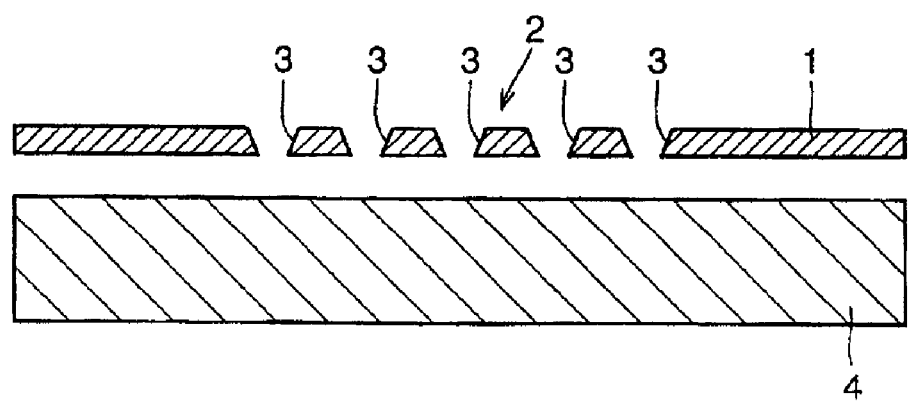

Then, the silicon oxide film 6 employed as an etching mask and the etching stopper layer 5 formed by a silicon oxide film are removed by hydrofluoric acid, thereby obtaining a shape shown in FIG. 7. The etching stopper 5 is thus removed for separating the support layer 4 consisting of silicon and the mask layer 1 formed by a silicon thin film from each other. Thus, the mask layer 1 formed by a silicon thin film including the mask pattern 2 having the tapered mask openings 3 according to the first embodiment can be delivered.

(Second Embodiment)

Figure 8:
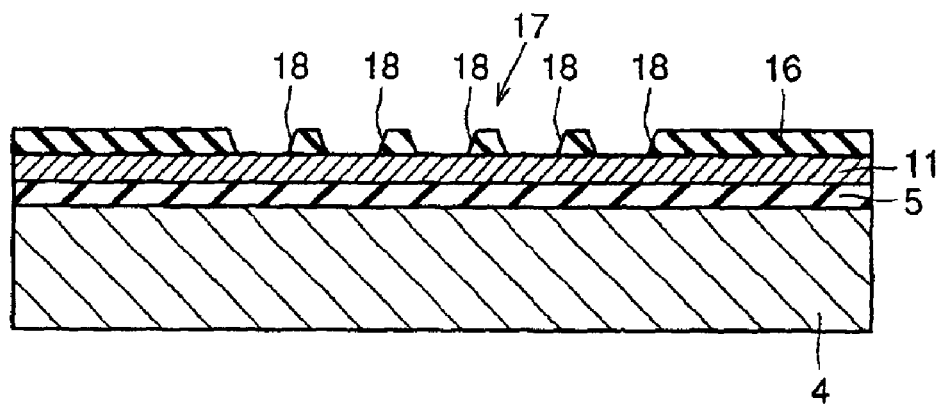
FIGS. 8 to 10 are sectional views for illustrating a process of preparing a deposition mask according to a second embodiment of the present invention.
Figure 9:
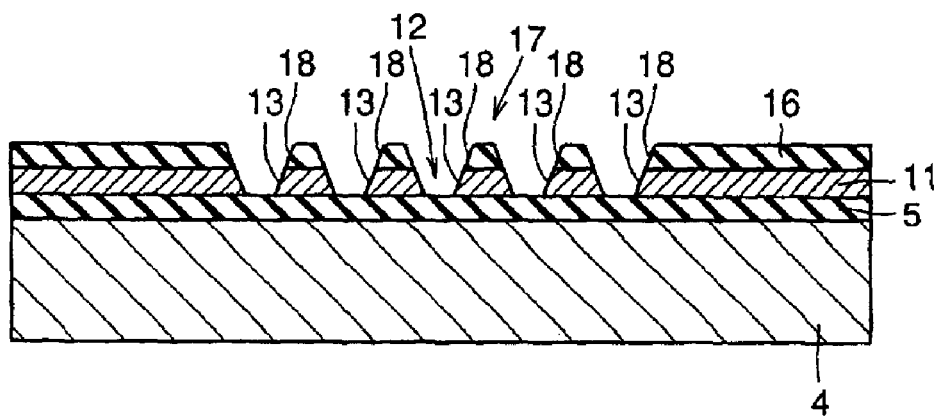
Figure 10:
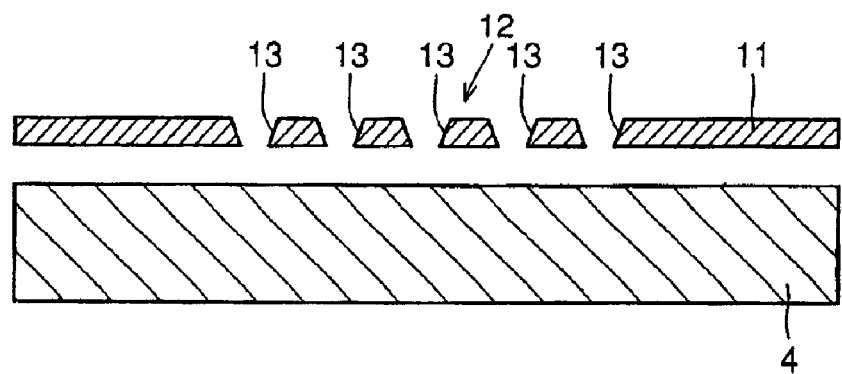

FIGS. 8 to 10 are sectional views showing a process of preparing a deposition mask according to a second embodiment of the present invention. The process of preparing a deposition mask according to the second embodiment is now described with reference to FIGS. 8 to 10.

Figure 4:
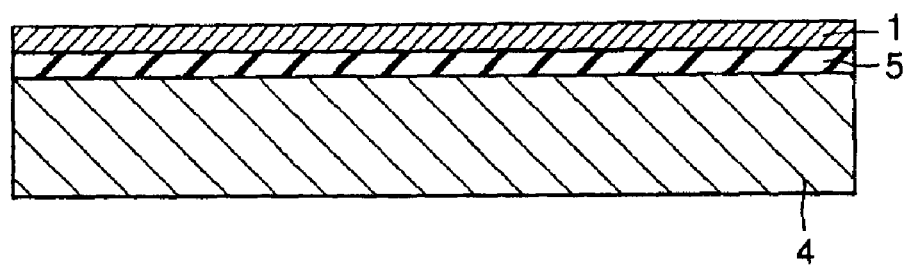
FIGS. 4 to 7 are sectional views for illustrating a process of preparing the deposition mask according to the first embodiment of the present invention.

First, an SOI substrate of a three-layer structure having a support layer 4 consisting of silicon, an etching stopper layer 5 formed by a silicon oxide film and a mask layer 11 formed by a silicon thin film is formed through a process similar to that according to the first embodiment shown in FIG. 4. According to the second embodiment, the silicon thin film forming the mask layer 11 has (100) plane orientation. Thereafter a silicon nitride film 16 is formed on the mask layer 11 formed by a silicon thin film in a thickness of about 1 μm by plasma CVD. A pattern 17 having tapered openings 18 is formed on the silicon nitride film 16 by photolithography and dry etching. In this case, the silicon nitride film 16 is etched under conditions of a plasma output of 500 W, a pressure of 15 Pa, a substrate temperature of 20° C. and a $CF_4$ and Ar gas ratio of 1:3, for example.

As shown in FIG. 9, anisotropic wet etching is performed on the mask layer 11 formed by a silicon thin film through the pattern 17 of the silicon nitride film 16 serving as a mask with an alkaline etching solution such as an aqueous solution of potassium hydroxide (KOH). In this case, the alkaline etching solution has crystal orientation dependency on the etching rate, and hence an etching surface of a (111) plane is formed when silicon forming the mask layer 11 has (100) plane orientation. Thus, a mask pattern 12 having tapered mask openings 13 can be obtained. According to the second embodiment, the mask openings 13 having a large cone angle can be readily formed by employing anisotropic etching as described above.

The etching rate for a silicon oxide film with the aqueous solution of potassium hydroxide (KOH) is so slow that the etching stopper layer 5 formed by a silicon oxide film can serve as an etching stopper in the anisotropic wet etching with the aqueous solution of KOH.

Thereafter the etching stopper layer 5 formed by a silicon oxide film and the silicon nitride film 16 employed as an etching mask are removed with hydrofluoric acid thereby separating the support layer 4 consisting of silicon and the mask layer 11 formed by a silicon thin film from each other as shown in FIG. 10. Thus, the mask layer 11 formed by a silicon thin film provided with the mask pattern 12 having the tapered mask openings 13 can be readily delivered. This mask layer 11 is employed as a deposition mask.

(Third Embodiment)

FIGS. 11 to 15 are sectional views showing a process of preparing a deposition mask according to a third embodiment of the present invention. The process of preparing a deposition mask according to the third embodiment is now described with reference to FIGS. 11 to 15. According to the third embodiment, a support for improving mechanical strength is bonded to the mask layer 1 or 11 formed by a silicon thin film formed in the first or second embodiment. In the following description, the support is bonded to the mask layer 1 according to the first embodiment.

Figure 11:
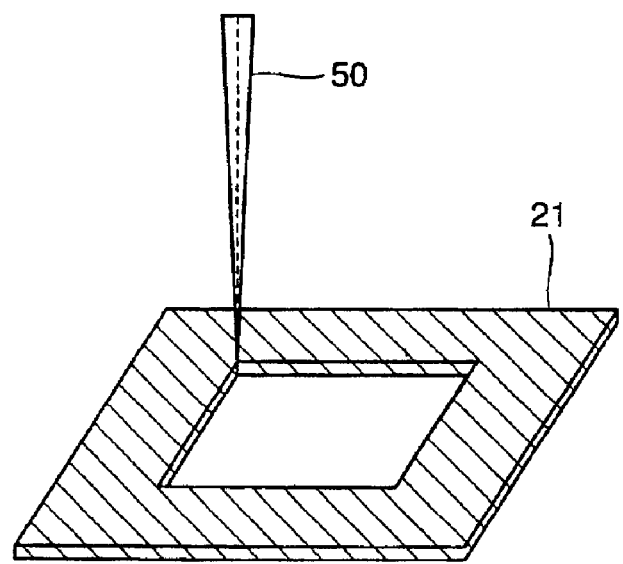
FIG. 11 is a perspective view for illustrating a process of preparing a deposition mask according to a third embodiment of the present invention.

As shown in FIG. 11, a silicon substrate having a thickness of about 625 μm is worked with a YAG laser 50 thereby forming a support 21 consisting of silicon. In this case, a part of the silicon substrate irradiated with the YAG laser 50 is removed.

Figure 12:
FIGS. 12 to 15 are sectional views for illustrating the process of preparing the deposition mask according to the third embodiment of the present invention.

As shown in FIG. 12, a film of gold (Au) is formed on one surface of the support 21 consisting of silicon and thereafter heated to 300° C. to 500° C., thereby forming a eutectic layer 22 of gold and silicon on the surface of the support 21.

Figure 13:
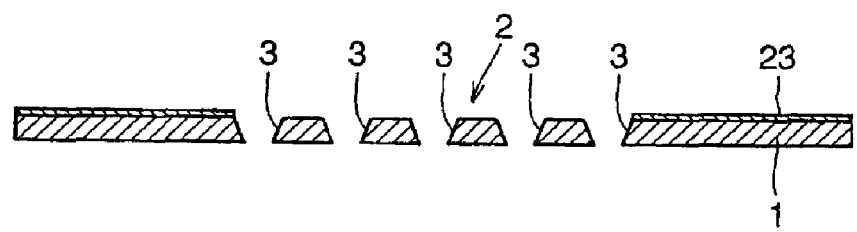

As shown in FIG. 13, a film of gold is formed on the surface (closer to a deposition source) of the mask layer 1 and thereafter heated to 300° C. to 500° C., thereby forming a eutectic layer 23 of gold and silicon on the surface of the mask layer 1.

Figure 14:
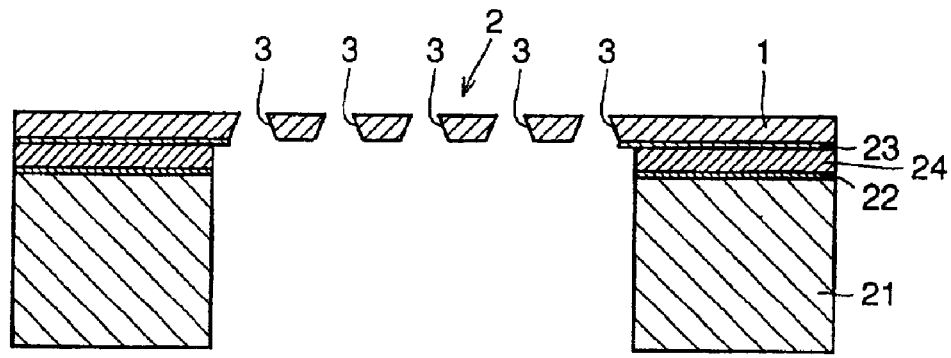

As shown in FIG. 14, a metal thin film 24 having a thickness of about 1 μm is held between the surfaces of the mask layer 1 and the support 21 formed with the eutectic layers 23 and 22 respectively. This metal thin film 24 serves as a buffer layer. The substance shown in FIG. 14 is heated to 300° C. to 500° C., thereby bonding the support 21 consisting of silicon and the mask layer 1 formed by a silicon thin film to each other.

Figure 15:
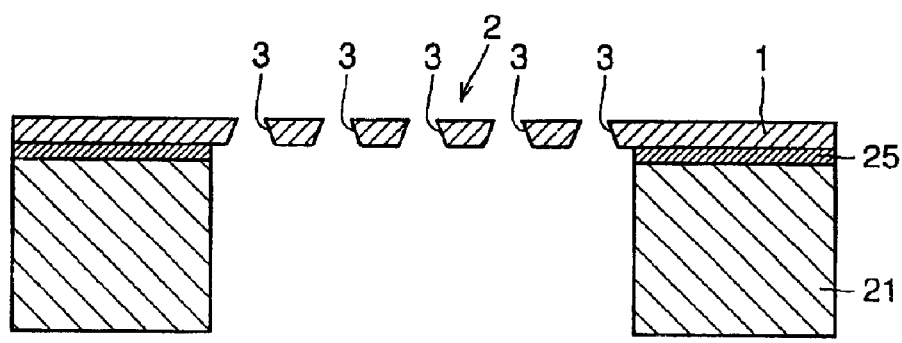

Due to this bonding, the metal thin film 24 is integrated with the eutectic layers 22 and 23, to form a eutectic layer 25 of silicon and gold as shown in FIG. 15. Thus, the support 21 consisting of silicon can be readily bonded to the mask layer 1 formed by a silicon thin film. Consequently, a deposition mask comprising the mask layer 1 formed by a silicon thin film and the support 21 consisting of silicon can be obtained. In employment of this deposition mask, the deposition source is scattered from the rear side of the mask layer 1 (closer to the support 21) toward the upper surface of the mask layer 1, thereby forming a deposit (not shown) on a target substrate (not shown).

A process of forming the support 21 on the mask layer 11 according to the second embodiment is similar to the aforementioned process.

According to the third embodiment, the mechanical strength of the deposition mask can be improved by providing the support 21 supporting the mask layer 1 as described above, whereby the deposition mask can be readily handled. Further, deflection caused by temperature change can be effectively prevented by preparing the support 1 from silicon similarly to the mask layer 1 formed by a silicon thin film. According to the third embodiment, further, the mask layer 1 and the support 21 are bonded with each other through the eutectic layer 25 of silicon and gold, thereby preventing generation of gas in a deposition apparatus and improving chemical resistance.

According to the third embodiment, the mechanical strength of the deposition mask can be improved by bonding the support 21 to the mask layer 1 as hereinabove described, whereby the thickness of the mask layer 1 or 11 formed by a silicon thin film can be further reduced as compared with the case of forming the deposition mask by only the mask layer 1 or 11 according to the first or second embodiment. For example, the thickness of the mask layer 1 or 11 formed by a silicon thin film can be reduced to about 10 μm according to the third embodiment.

(Fourth Embodiment)

Figure 16:
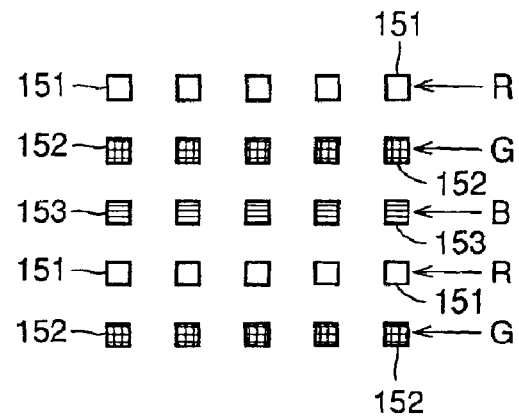
FIG. 16 is a plan view of deposit patterns of an organic EL display capable of making color display according to a fourth embodiment of the present invention.
Figure 17:
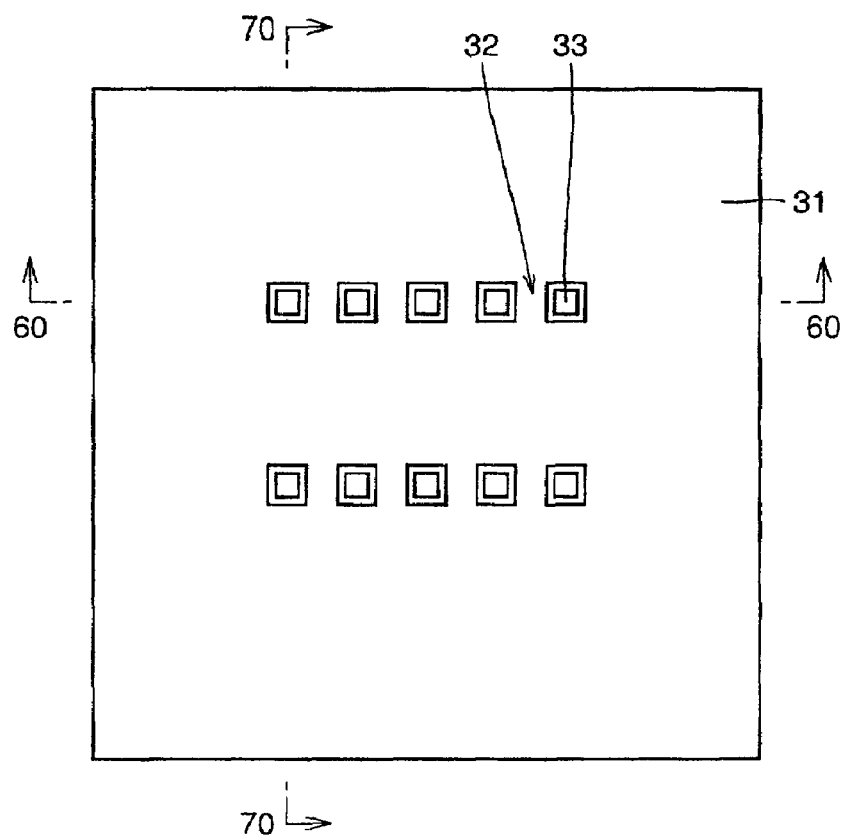
FIG. 17 is a top plan view of a deposition mask according to the fourth embodiment employed for forming any of the deposit patterns shown in FIG. 16.
Figure 18:
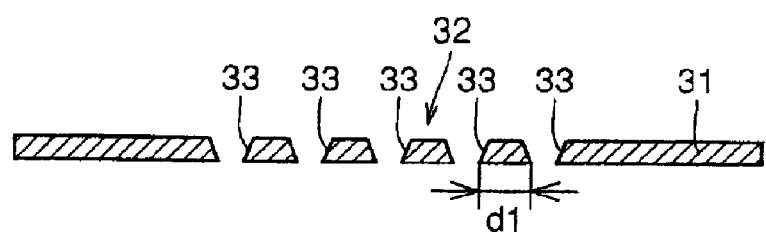
FIG. 18 is a sectional view of the deposition mask according to the fourth embodiment taken along the line 60—60 in FIG. 17.
Figure 19:
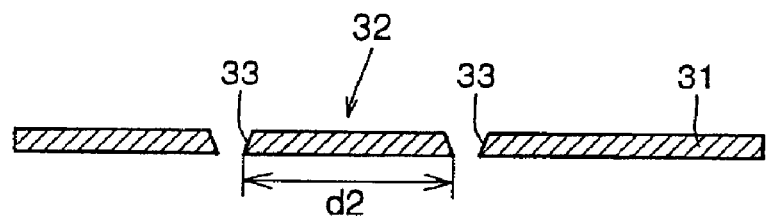
FIG. 19 is a sectional view of the deposition mask according to the fourth embodiment taken along the line 70—70 in FIG. 17.

FIG. 16 is a plan view showing deposit patterns 151, 152 and 153 of an organic EL display capable of making color display according to a fourth embodiment of the present invention. FIG. 17 is a plan view showing a deposition mask according to the fourth embodiment employed for forming any of the deposit patterns 151 to 153 shown in FIG. 16. FIG. 18 is a sectional view of the deposition mask according to the fourth embodiment taken along the line 60—60 in FIG. 17, and FIG. 19 is a sectional view of the deposition mask according to the fourth embodiment taken along the line 70—70 in FIG. 17. According to the fourth embodiment, intervals between mask openings of the deposition mask are different from each other dissimilarly to the aforementioned first to third embodiments.

In order to make color display on the organic EL display, different organic EL materials of the three primary colors, i.e., R (red), G (green) and B (blue) must be deposited. In this case, the deposit patterns 151, 152 and 153 of R (red), G (green) and B (blue) are arranged as shown in FIG. 16 respectively, for example. The three types of deposit patterns 151, 152 and 153 are deposited through different deposit masks respectively.

In order to deposit the deposit patterns 151 of R (red), for example, a mask layer 31 according to the fourth embodiment shown in FIG. 17 is employed. The mask layer 31 according to the fourth embodiment is formed by a single silicon thin film, and has a thickness of at least about 10 μm and not more than 100 μm, similarly to the mask layer 1 according to the first embodiment shown in FIGS. 1 and 2. A mask pattern 32 including tapered mask openings 33 having opening widths increased toward a deposition source is provided on the mask layer 31 formed by a silicon thin film.

In the mask layer 31 according to the fourth embodiment, the widths of non-opening parts between the mask openings 33 vary with the positions. In other words, the non-opening parts have the minimum width d1 and a larger width d2 in the sections shown in FIGS. 18 and 19 respectively.

In order to improve the organic EL display in brightness and definition, the minimum width d1 of the non-opening parts (non-emission parts) is preferably as small as possible. The minimum value of the minimum width d1 of the non-opening parts is expressed in the above equation (5). In other words, the minimum width d1 of the non-opening parts can be reduced as the thickness of the mask layer 31 is reduced. In the mask layer 31 having a small thickness of not more than 100 μm, the minimum width d1 of the non-opening parts can be reduced below 50 μm from the above equation (5).

On the other hand, the width d2 of the non-opening parts shown in FIG. 19 is at least several times the width d1, and hence the thickness of the mask layer 31 causes no problem.

Methods of forming and using the mask layer 31 according to the fourth embodiment are similar to those in any of the aforementioned first to third embodiments.

According to the fourth embodiment, the mask layer 31 formed by a silicon thin film similarly to the aforementioned first embodiment is reduced in specific gravity and increased in Young's modulus as compared with the conventional metal mask substrate (mask layer) 101 (see FIG. 22), to be lightweight and reduced in strain. Thus, deflection of the mask layer 31 caused by its own weight can be reduced as compared with the conventional metal mask substrate 101. Consequently, the thickness of the mask layer 31 can be more reduced as compared with the prior art. While it is difficult to reduce the thickness of the conventional metal mask substrate 101 to not more than about 200 μm, the mask layer 31 can be readily formed to have a thickness of not more than 100 μm according to this embodiment.

According to the fourth embodiment, as hereinabove described, the mask layer 31 formed by a silicon thin film having a small thickness of not more than 100 μm is employed when depositing the different organic EL materials of the three primary colors R, G and B, whereby the minimum width d1 of the non-opening parts can be reduced below 50 μm. Thus, the widths of the non-emission parts can be so reduced that the screen of the color display of the organic EL film can be improved in brightness as well as definition.

According to the fourth embodiment, further, the tapered mask openings 33 having the opening widths increased toward the deposition source are provided similarly to the aforementioned first embodiment, whereby the probability of deposit particles, obliquely scattered from the deposition source, hitting ends of the mask openings 33 can be reduced. Thus, nonuniformity of the thicknesses of the deposits can be so reduced that more uniform deposit patterns can be obtained in higher precision.

According to the fourth embodiment, as hereinabove described, nonuniformity of the thicknesses of the deposits can be more reduced similarly to the first embodiment, and the thickness of the mask layer 31 can be reduced for reducing the minimum width d1 of the non-opening parts.

(Fifth Embodiment)

Figure 20:
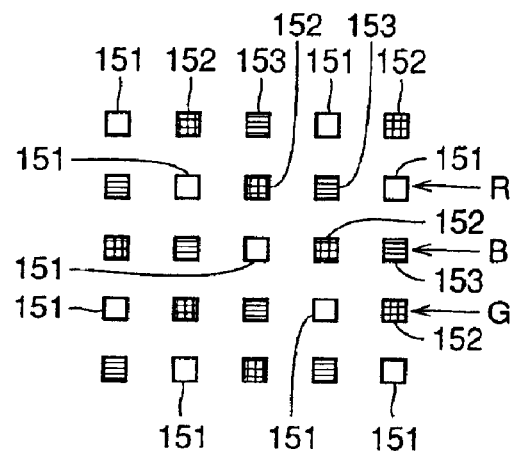
FIG. 20 is a plan view showing deposit patterns of an organic EL display capable of making color display according to a fifth embodiment of the present invention.
Figure 21:
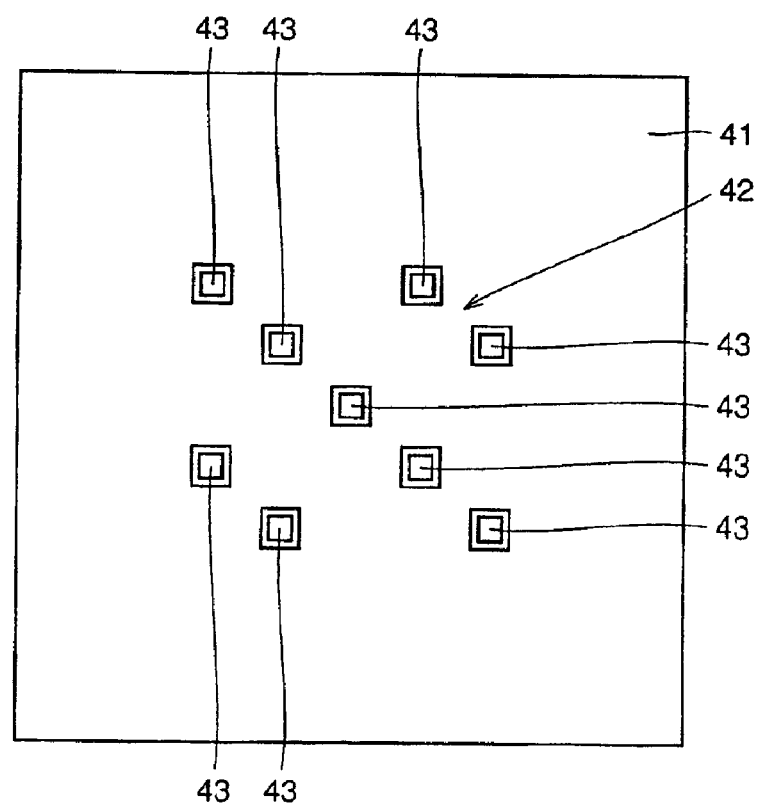
FIG. 21 is a top plan view of a deposition mask according to the fifth embodiment employed for forming any of the deposit patterns shown in FIG. 20.

FIG. 20 is a plan view showing deposit patterns 151, 152 and 153 of an organic EL display capable of making color display according to a fifth embodiment of the present invention. FIG. 21 is a plan view showing a deposition mask according to the fifth embodiment employed for forming any of the deposit patterns 151 to 153 shown in FIG. 20. According to the fifth embodiment, the arrangement of the deposit patterns 151 to 153 is different from that in the aforementioned fourth embodiment.

According to the fifth embodiment, the deposit patterns 151, 152 and 153 of the three primary colors R, G and B are arranged as shown in FIG. 20. In a mask layer 41 according to the fifth embodiment shown in FIG. 21, mask openings 43 are provided in correspondence to the deposit patterns 151 of R (red). The mask layer 41 according to the fifth embodiment is also formed by a single silicon thin film, and has a thickness of at least about 10 μm and not more than 100 μm. A mask pattern 42 including tapered mask openings 43 having opening widths increased toward a deposition source is provided on the mask layer 41 formed by a silicon thin film. In the mask layer 41 according to the fifth embodiment, the widths of non-opening parts between the mask openings 43 vary with the positions, similarly to the fourth embodiment.

Also in the fifth embodiment, the thickness of the mask layer 41 formed by a lightweight silicon thin film having small strain can be reduced below 100 μm, whereby the minimum width of the non-opening parts between the mask openings 43 of the mask layer 41 can be reduced below 50 μm. Thus, the widths of non-emission parts can be reduced, whereby the screen of the color display formed by the organic EL film can be improved in brightness as well as definition.

Although the present invention has been described and illustrated in detail, it is clearly understood that the same is by way of illustration and example only and is not to be taken by way of limitation, the spirit and scope of the present invention being limited only by the terms of the appended claims.

While the pattern 7 having the tapered openings 8 is first formed on the silicon oxide film 6 for performing dry etching on the mask layer 1 through the mask of the pattern 7 thereby forming the tapered mask openings 3 in the aforementioned first embodiment, for example, the present invention is not restricted to this but a resist pattern may alternatively be directly formed on the mask layer 1 for forming the tapered mask openings 3 in the mask layer 1 by performing dry etching through the resist pattern serving as a mask.

While the mask layer 1 and the support 21 are bonded to each other through the metal thin film 24 and the eutectic layers 22 and 23 in the step shown in FIG. 14 in the third embodiment, the present invention is not restricted to this but the gold thin film 24 may be removed for bonding the mask layer 1 and the support 21 only through the eutectic layers 22 and 23.

While the mask layer 1 and the support 21 are bonded to each other through the eutectic layer 25 of silicon and gold in the third embodiment, the present invention is not restricted to this but a layer of resin (adhesive) such as polyimide resin may be applied to the bonded surfaces and heated for bonding the mask layer 1 and the support 21 to each other in place of the eutectic layer 25. In this case, the layer of resin such as polyimide resin is formed in a thickness of about 1 μm and heated at about 150° C. for about 30 minutes, for bonding the mask layer 1 and the support 21 to each other. An adhesive other than polyimide resin may alternatively be employed. When an adhesive is employed, the mask layer 1 and the support 21 can be bonded to each other through a simpler step.

On the premise of employment of the aforementioned adhesive, the support 21 may be prepared not from silicon but from a metal material having a thermal expansion coefficient close to that of silicon. For example, covar (29Ni-18Co—Fe) is employable as such a metal material. Also when the support 21 is made of a material having a thermal expansion coefficient close to that of silicon forming the mask layer 1, deflection caused by temperature change can be advantageously reduced.

While an organic EL film is employed as the deposition source in each of the aforementioned embodiments, the present invention is not restricted to this but is also applicable to another deposition source.

What is claimed is:

1. A deposition mask employed for depositing a deposit material on a target substrate, comprising:
    a mask layer formed by a single silicon thin film; and
    a mask pattern, formed on said mask layer formed by a single silicon thin film, including a mask opening having an opening width increased toward a deposition source.
2. The deposition mask according to claim 1, wherein said mask layer formed by a single silicon thin film has a thickness of at least 10 μm and not more than 100 μm.
3. The deposition mask according to claim 1, wherein a non-opening part of said mask layer formed by a single silicon thin film has a width of not more than 50 μm.
4. The deposition mask according to claim 1, wherein said mask opening of said mask layer formed by a single silicon thin film has a cone angle of at least 5° and not more than 70°.
5. The deposition mask according to claim 1, wherein said mask opening includes a tapered through hole formed by performing dry etching on said mask layer.
6. The deposition mask according to claim 1, wherein said mask opening includes a tapered through hole formed by performing anisotropic wet etching on said mask layer.
7. The deposition mask according to claim 6, wherein said mask layer is formed by a single-crystalline silicon thin film having a (100) plane.
8. The deposition mask according to claim 1, further comprising a support bonded to said mask layer for supporting said mask layer.
9. The deposition mask according to claim 8, wherein said support contains silicon.
10. The deposition mask according to claim 9, wherein said mask layer and said support are bonded to each other by a eutectic layer of silicon and gold.
11. The deposition mask according to claim 8, wherein said support contains a metal material having a thermal expansion coefficient close to that of silicon.
12. The deposition mask according to claim 11, wherein said support contains covar (29Ni-18Co—Fe).
13. The deposition mask according to claim 8, wherein said support and said mask are bonded to each other through an adhesive layer.
14. The deposition mask according to claim 1, wherein said target substrate includes a plurality of first deposition regions subjected to deposition of a first material and a plurality of second deposition regions subjected to deposition of a second material different from said first material,
    a plurality of said mask openings of said mask pattern are provided on positions corresponding to either said first deposition regions or said second deposition regions, and
    said plurality of mask openings are at least partially provided at different intervals.
15. The deposition mask according to claim 14, wherein the minimum width of a non-opening part between said plurality of mask openings is not more than 50 μm.

* * * * *